United States Patent
Tomono et al.

(12) 
(10) Patent No.: US 11,309,219 B2
(45) Date of Patent: Apr. 19, 2022

(54) METHOD FOR MANUFACTURING SEMICONDUCTOR DEVICE

(71) Applicant: Kioxia Corporation, Minato-ku (JP)

(72) Inventors: Akira Tomono, Yokkaichi (JP); Keisuke Tokubuchi, Yokkaichi (JP); Takanobu Ono, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 120 days.

(21) Appl. No.: 16/809,649

(22) Filed: Mar. 5, 2020

(65) Prior Publication Data

US 2021/0082761 A1   Mar. 18, 2021

(30) Foreign Application Priority Data

Sep. 17, 2019   (JP) .............................. JP2019-168888

(51) Int. Cl.
*H01L 21/78* (2006.01)
*H01L 21/50* (2006.01)
*H01L 21/60* (2006.01)

(52) U.S. Cl.
CPC .............. *H01L 21/78* (2013.01); *H01L 21/50* (2013.01); *H01L 2021/60022* (2013.01)

(58) Field of Classification Search
None
See application file for complete search history.

(56) References Cited

U.S. PATENT DOCUMENTS

| | | | |
|---|---|---|---|
| 6,607,970 B1 | 8/2003 | Wakabayashi | |
| 8,264,079 B2 | 9/2012 | Iwase et al. | |
| 9,425,177 B2 | 8/2016 | Koyanagi et al. | |
| 9,484,227 B1* | 11/2016 | Cheng | H01L 25/105 |
| 10,825,798 B2* | 11/2020 | Lee | H01L 21/78 |
| 2012/0119354 A1* | 5/2012 | Tsai | H01L 21/563 |
| | | | 257/737 |
| 2013/0157414 A1* | 6/2013 | Ho | H01L 29/0657 |
| | | | 438/113 |
| 2014/0110842 A1* | 4/2014 | Zenz | H01L 21/78 |
| | | | 257/738 |
| 2014/0167266 A1* | 6/2014 | Schneegans | H01L 23/3171 |
| | | | 257/741 |

(Continued)

FOREIGN PATENT DOCUMENTS

| | | |
|---|---|---|
| JP | 03-095639 U | 9/1991 |
| JP | 2001-144121 A | 5/2001 |

(Continued)

*Primary Examiner* — Evren Seven

(74) *Attorney, Agent, or Firm* — Oblon, McClelland, Maier & Neustadt, L.L.P.

(57) ABSTRACT

A method for manufacturing a semiconductor device of an embodiment includes: dividing a semiconductor wafer including a plurality of chip areas each having a columnar electrode and dicing areas, along the dicing areas to form a plurality of semiconductor chips; sticking a first resin film on the plurality of semiconductor chips while filling parts of the first resin film in gaps each present between adjacent ones of the plurality of semiconductor chips; forming trenches narrower in width than the gaps in the first resin film filled in the gaps; and sequentially picking up the plurality of semiconductor chips each having the first resin film, and mounting the picked semiconductor chip on a substrate.

19 Claims, 10 Drawing Sheets

(56) References Cited

U.S. PATENT DOCUMENTS

2016/0079204 A1    3/2016  Matsubara et al.
2017/0154853 A1\*  6/2017  Pueschner ............... H01L 21/78
2019/0348356 A1\* 11/2019  Hsieh ................ H01L 23/49822
2020/0010675 A1\*  1/2020  Yamatsu .................. H01L 24/32

FOREIGN PATENT DOCUMENTS

| | | |
|---|---|---|
| JP | 2011-129779 A | 6/2011 |
| JP | 5474630 B2 | 4/2014 |
| TW | 201611186 A | 3/2016 |
| TW | 201932558 A | 8/2019 |

\* cited by examiner (UNDER REDUCED PRESSURE)

(ATMOSPHERE EXPOSURE)

METHOD FOR MANUFACTURING SEMICONDUCTOR DEVICE

CROSS REFERENCE TO RELATED APPLICATION

This application is based upon and claims the benefit of priority from Japanese Patent Application No. 2019-168888, filed on Sep. 17, 2019; the entire contents of which are incorporated herein by reference.

FIELD

Embodiments disclosed herein relate to a method for manufacturing a semiconductor device.

BACKGROUND

As a method of mounting a semiconductor chip on a substrate such as a circuit board, a mounting method using a thermoplastic non conductive resin film (Non Conductive Film: NCF) is known, for instance. In the mounting method using NCF, NCF is first stuck on electrode formation surfaces of a plurality of divided semiconductor chips, and then, NCF is cut into parts corresponding to the plurality of divided semiconductor chips. The semiconductor chip having the divided part of NCF is bonded to the substrate with NCF therebetween, so that electrodes of the semiconductor chip and electrodes of the substrate are connected. Such a mounting method using NCF may not achieve sufficient bonding strength of the semiconductor chip, and the semiconductor chip easily peels off when the substrate is contracted by, for example, heat application.

SUMMARY

A method for manufacturing a semiconductor device of an embodiment includes: dividing a semiconductor wafer including a plurality of chip areas which each have a columnar electrode and dicing areas which demarcate the plurality of chip areas, along the dicing areas to separate the plurality of chip areas and thus form a plurality of semiconductor chips; sticking a first resin film on the plurality of semiconductor chips from a first surface side having the columnar electrodes, of the semiconductor wafer while filling parts of the first resin film in gaps each present between adjacent ones of the plurality of semiconductor chips; dividing the first resin film into parts corresponding to the plurality of semiconductor chips by forming trenches narrower in width than the gaps in the first resin film filled in the gaps while leaving the first resin film on side surfaces of the divided semiconductor chips; and sequentially picking up the plurality of semiconductor chips each having the part of the divided first resin film, and mounting the picked semiconductor chip on a substrate with the first resin film therebetween while joining the columnar electrode of the semiconductor chip to an electrode of the substrate.

DETAILED DESCRIPTION

Semiconductor device manufacturing methods of embodiments will be hereinafter described with reference to the drawings. In the embodiments, substantially the same constituent parts are denoted by the same reference signs, and a description thereof may be partly omitted. The drawings are schematic, and the relation of thickness and planer dimension, a thickness ratio among parts, and so on may be different from actual ones. Terms indicating directions such as up and down in the description indicate relative directions in a case where a columnar electrode formation surface of a later-described semiconductor wafer is defined as an upper side unless otherwise specified, and may be different from the actual directions based on the gravitational acceleration direction.

First Embodiment

Figure 1A:
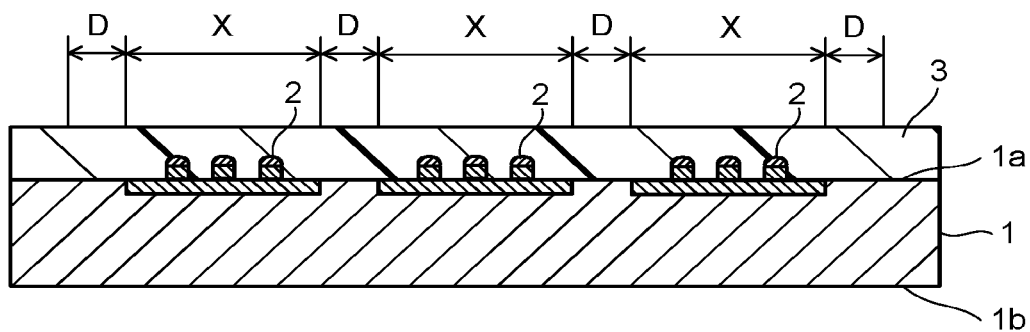
FIG. 1A to FIG. 1E are cross-sectional views illustrating a semiconductor device manufacturing method according to a first embodiment.
Figure 1B:
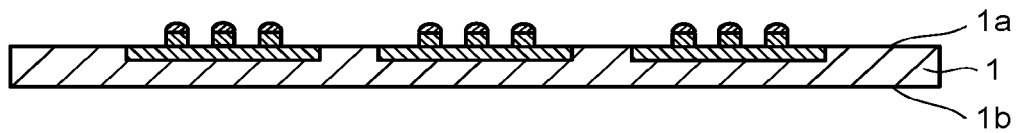
Figure 1C:
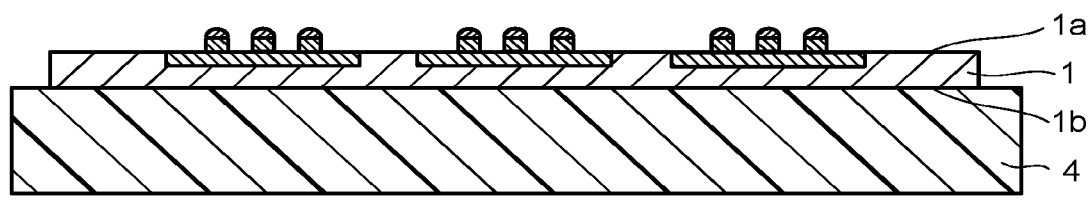
Figure 1D:
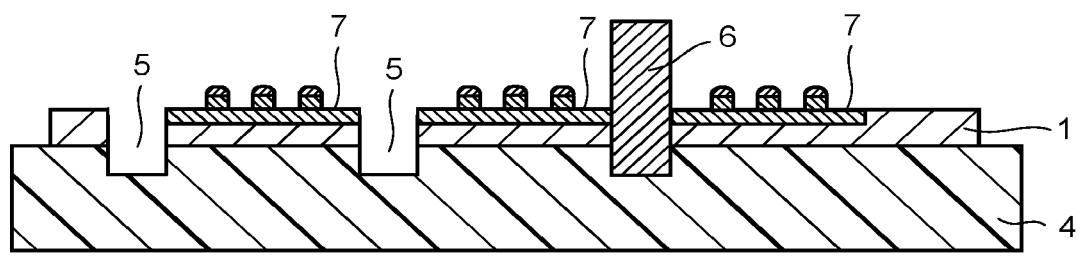
Figure 1E:
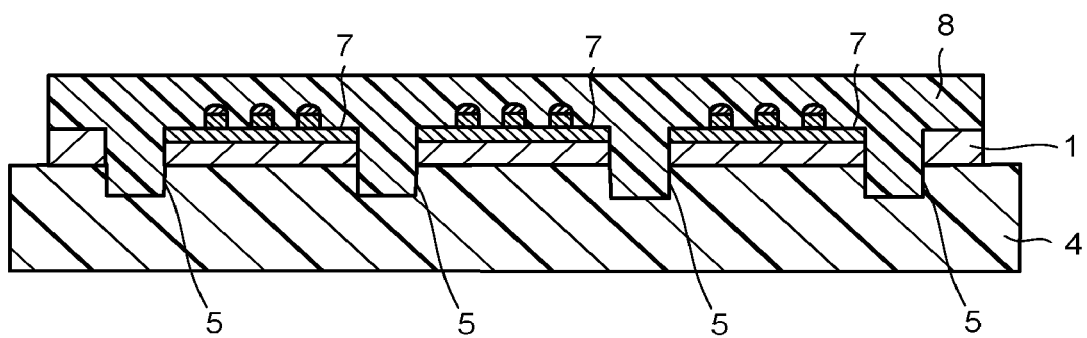
Figure 2A:
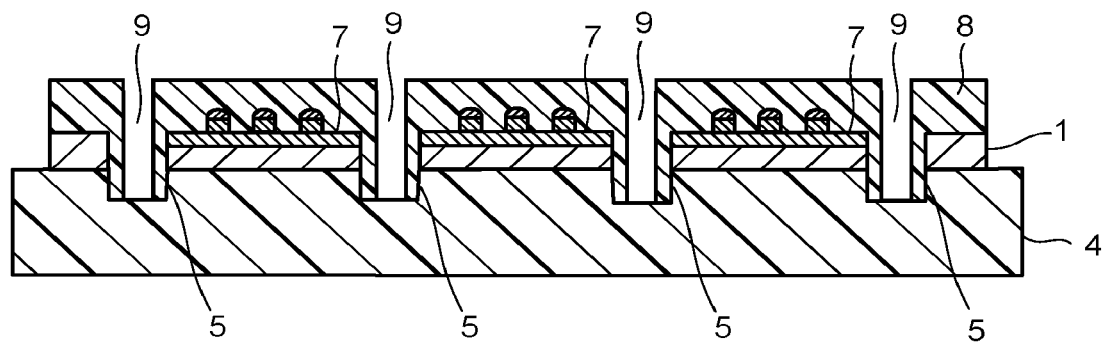
FIG. 2A to FIG. 2C are cross-sectional views illustrating the semiconductor device manufacturing method according to the first embodiment.
Figure 2B:
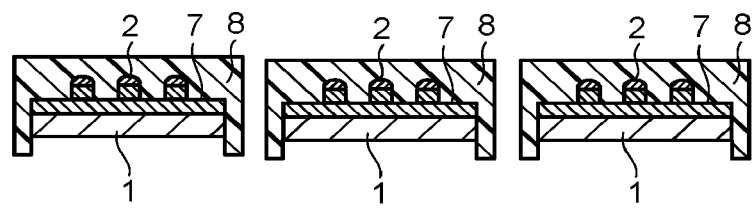
Figure 2C:
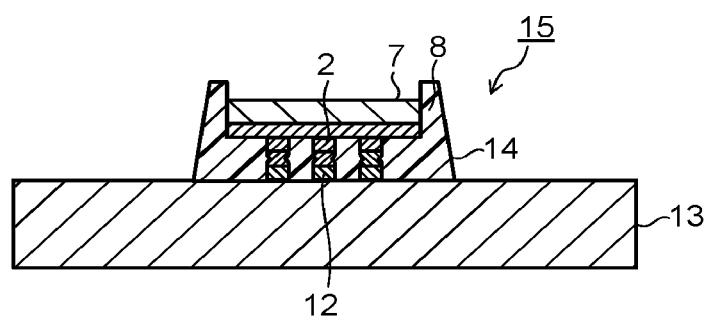

FIG. 1A to FIG. 1E and FIG. 2A to FIG. 2C are views illustrating a semiconductor device manufacturing method according to a first embodiment. FIG. 1A to FIG. 1E are cross-sectional views illustrating a step of preparing a semiconductor wafer up to a step of sticking and filling a non conductive film, and FIG. 2A to FIG. 2C are cross-sectional views illustrating a step of dividing the non conductive film up to a step of mounting a semiconductor chip.

First, as illustrated in FIG. 1A, a semiconductor wafer 1 is prepared. The semiconductor wafer 1 has a plurality of chip areas X which each have columnar electrodes (bump electrodes) 2 and dicing areas D which demarcate the plurality of chip areas X. Not-illustrated semiconductor elements are provided on a surface which the columnar electrodes 2 are formed, of the semiconductor wafer 1. On a first surface 1a having the columnar electrodes 2, of such a semiconductor wafer 1, a surface protective tape 3 is stuck. Next, after a second surface 1b of the semiconductor wafer 1 opposite to the first surface 1a is ground to a thickness according to the thickness of semiconductor chips that are to be manufactured, the surface protective tape 3 is peeled off (FIG. 1B). The step of peeling off the surface protective tape 3 is sometimes carried out after a step of sticking a dicing tape (second resin film) 4 described below.

Next, as illustrated in FIG. 1C, the dicing tape 4 is stuck on the ground second surface 1b of the semiconductor wafer 1. A wafer ring, not illustrated, supports an outer peripheral part of the dicing tape 4. Next, as illustrated in FIG. 1D, first trenches 5 are formed in the semiconductor wafer 1 from the first surface 1a side along the dicing areas D to divide the semiconductor wafer 1. The first trenches 5 are formed by a dicing step using a dicing blade 6 such as a diamond blade, for instance. At this time, the dicing step is carried out to cut apart the semiconductor wafer 1 while bringing the dicing tape 4 into a half-cut state in which it is cut only partly in the thickness direction. As a result of forming gaps each between adjacent ones of the plurality of chip areas X by forming the first trenches 5, the plurality of chip areas X are separated from one another, resulting in the formation of a plurality of semiconductor chips 7. The whole shape of the semiconductor wafer 1 having the separated semiconductor chips 7 is maintained by the dicing tape 4. The first trenches 5 are each formed with a first width (gap) such that the plurality of chip areas X come to have a desired semiconductor chip shape.

Figure 3A:
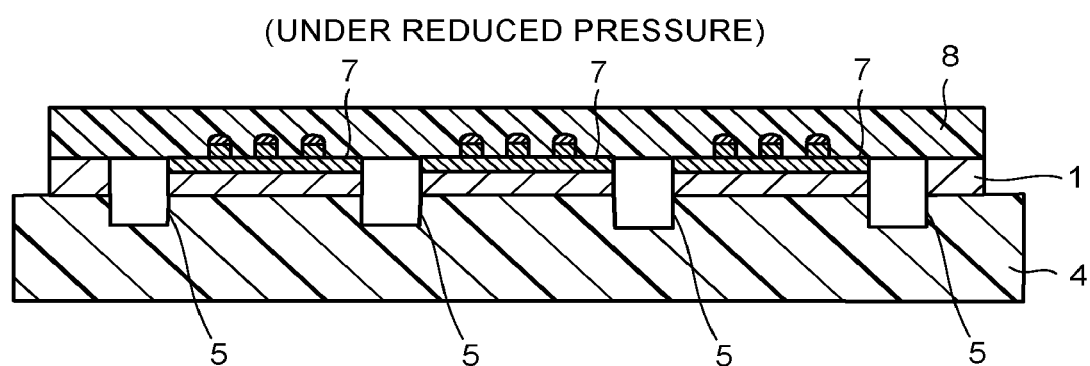
FIG. 3A and FIG. 3B are cross-sectional views illustrating steps of sticking and filling a non conductive film in the semiconductor device manufacturing method illustrated in FIG. 1A to FIG. 1E.
Figure 3B:
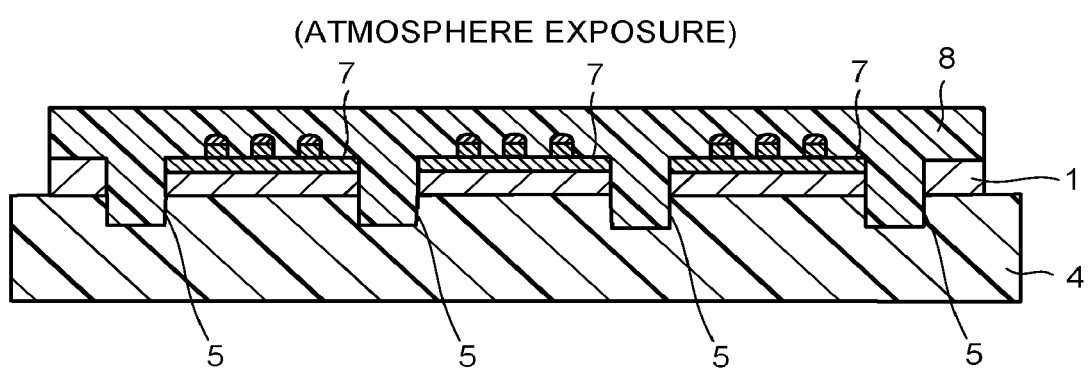

Next, as illustrated in FIG. 1E, a thermoplastic non conductive resin film (NCF) (first resin film) 8 is stuck on the plurality of separated semiconductor chips 7 from the first surface 1a side of the semiconductor wafer 1. At this time, parts of the NCF 8 are filled in the first trenches 5. For the step of filling the NCF 8 in the first trenches 5, various methods can be employed. For example, a sticking step under a reduced pressure and a filling step under an atmospheric pressure illustrated in FIG. 3A and FIG. 3B respectively can be employed. Specifically, as illustrated in FIG. 3A, under the reduced pressure, the NCF 8 is stuck on the plurality of semiconductor chips 7 under a heating condition of about 60° C. Next, as illustrated in FIG. 3B, the NCF 8 stuck under the reduced pressure is exposed to the atmosphere, whereby the parts of the NCF 8 are filled in the first trenches 5.

The heating of the NCF 8, for example, the partial heating of its parts corresponding to the first trenches 5 may be combined with the atmosphere exposure of the NCF 8. For the partial heating, hot air or laser is used, for instance. The partial heating is preferably carried out from the center toward an outer side in order not to leave vacancies in the first trenches 5. Instead, the NCF 8 may be entirely heated using a heater, an oven, or the like. In the case of the entire heating, the heating along with pressure application is also effective. Combining the heating of the NCF 8 makes it possible to enhance the filling performance of the NCF 8 in the first trenches 5. Further, depending on the material or the like of the NCF 8, only with the heating (the partial heating or the entire heating) of the NCF 8, it may be possible to fill the NCF 8 in the first trenches 5 without employing the step of sticking the NCF 8 under the reduced pressure.

Next, as illustrated in FIG. 2A, second trenches 9 are formed in the NCF 8 filled in the first trenches 5 to divide the NCF 8 into parts corresponding to the plurality of semiconductor chips 7. The second trenches 9 are formed with a width narrower than the width of the first trenches 5. Consequently, the NCF 8 remains on side surfaces of the two semiconductor chips 7 arranged across the first trench 5. The NCF 8 remaining on the side surfaces of the semiconductor chip 7 contributes to the formation of a fillet which is a resin layer to cover the side surface of the semiconductor chip 7a when the semiconductor chip 7 is mounted on a substrate, making it possible to increase the mounting strength of the semiconductor chip 7 as will be described later. The width of the second trenches 9 is preferably adjusted such that the NCF 8 with 5 μm or more remains on each of the side surfaces of the two semiconductor chips 7. For example, in a case where the width of the first trenches 5 is about 35 μm to about 40 μm, the width of the second trenches 9 is preferably about 25 μm to about 30 μm so that the NCF 8 with 5 μm or more remains on each of the side surfaces of the two semiconductor chips 7. Further, to leave the NCF 8 with about 10 μm on each of the side surfaces of the two semiconductor chips 7, the width of the second trenches 9 is preferably about 15 μm to about 20 μm.

Figure 4:
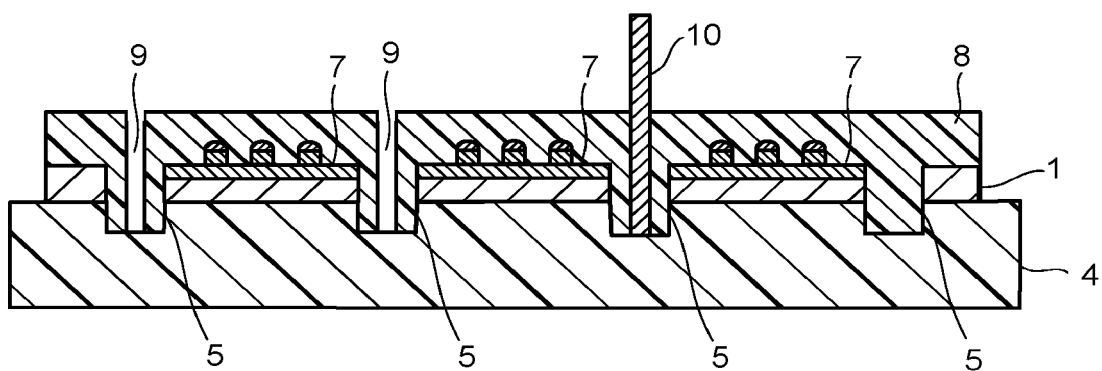
FIG. 4 is a cross-sectional view illustrating a first example of a step of dividing the non conductive film in the semiconductor device manufacturing method illustrated in FIG. 2A to FIG. 2C.
Figure 5A:
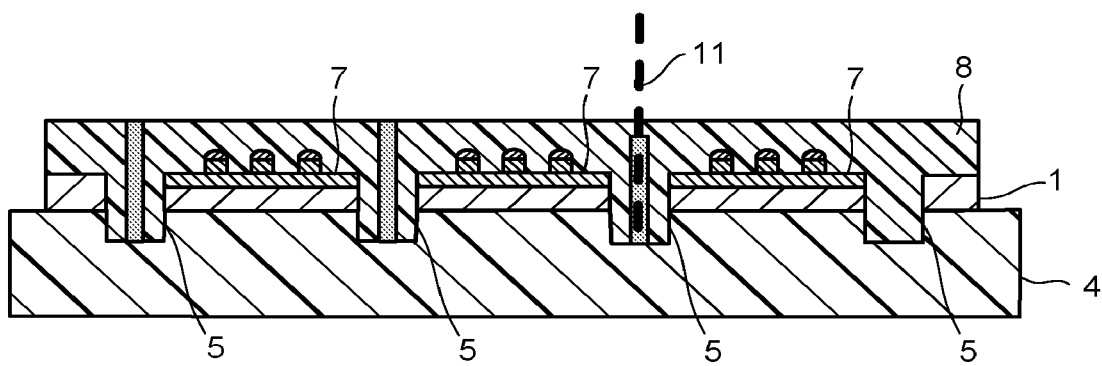
FIG. 5A and FIG. 5B are cross-sectional views illustrating a second example of the step of dividing the non conductive film in the semiconductor device manufacturing method illustrated in FIG. 2A to FIG. 2C.
Figure 5B:
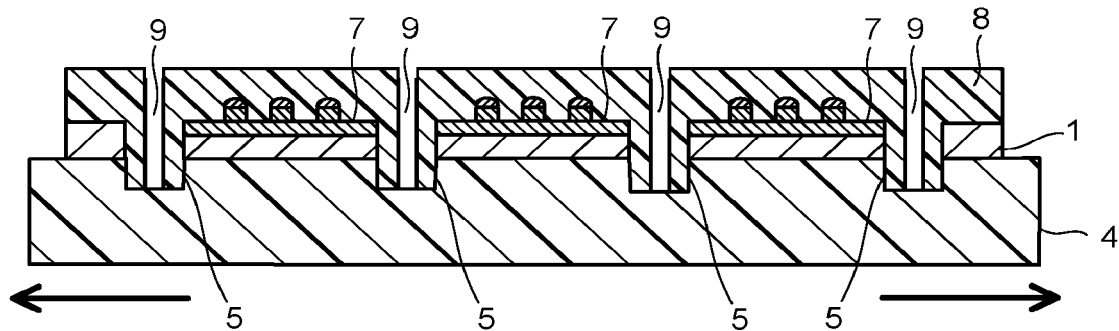

For the step of forming the second trenches 9, various methods can be employed. For example, as illustrated in FIG. 4, the NCF 8 filled in the first trenches 5 is cut using a second dicing blade 10 narrower in width than the first dicing blade 6 used in the formation of the first trenches 5. This makes it possible to form the second trenches 9 in the NCF 8 filled in the first trenches 5. Instead, as illustrated in FIG. 5A, the NCF 8 filled in the first trenches 5 is irradiated with laser light 11 to be cut. Next, as illustrated in FIG. 5B, the dicing tape 4 on which the plurality of semiconductor chips 7 are stuck is expanded in its planar direction, whereby the second trenches 9 are formed. The step of expanding the dicing tape 4 is preferably carried out since the NCF 8 is sometimes partly left adhering to each other in the laser dicing.

Figure 6:
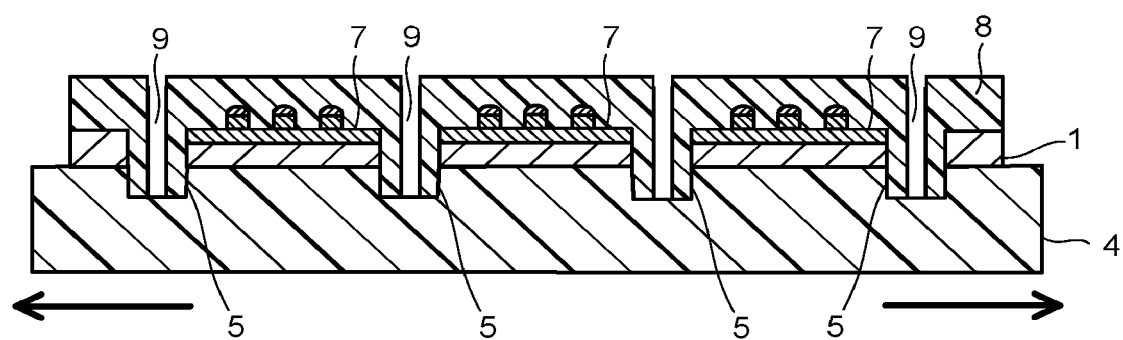
FIG. 6 is a cross-sectional view illustrating a third example of the step of dividing the non conductive film in the semiconductor device manufacturing method illustrated in FIG. 2A to FIG. 2C.

As illustrated in FIG. 6, depending on the material or the like of the dicing tape 4, only with the expanding step, it is possible to form the second trenches 9 in some cases without the laser dicing step. In this case, after the NCF 8 stuck under the reduced pressure is exposed to the atmosphere and parts of the NCF 8 are filled in the first trenches 5, the dicing tape 4 is expanded in its planar direction to divide the NCF 8 filled in the first trenches 5, whereby the second trenches 9 are formed. However, only with the expanding step, there may occur a variation in the formation positions of the second trenches 9 to cause the nonuniformity in the thickness of the NCF 8 remaining on the side surfaces of the semiconductor chips 7. Therefore, the laser dicing step is preferably combined. The expanding step may be combined after the blade dicing.

As a result of forming the second trenches 9 in the NCF 8 filled in the first trenches 5 to divide the NCF 8 into parts corresponding to the plurality of semiconductor chips 7, the semiconductor chips 7 each having the separated part of the NCF 8 are formed. As illustrated in FIG. 2B, such semiconductor chips 7 having the NCF 8 are sequentially picked up from the dicing tape 4. Next, the semiconductor chip 7 having the NCF 8, which is picked up from the dicing tape 4, is turned upside down in the middle of the mounting step, and as illustrated in FIG. 2C, is thereafter mounted on a substrate 13 having electrodes 12, whereby a semiconductor device 15 is fabricated. The semiconductor chip 7 is mounted on the substrate 13 while its columnar electrodes 2 are connected to the electrodes 12 of the substrate 13, whereby the semiconductor device 15 is fabricated.

The mounting of the semiconductor chip 7 is carried out as follows, for instance. First, the second surface 1b of the semiconductor chip 7 is held with a not-illustrated mounting tool, and the semiconductor chip 7 is pressed against the substrate 13 to bring the columnar electrodes 2 of the semiconductor chip 7 into contact with the electrodes 12 of the substrate 13. While the columnar electrodes 2 and the electrodes 12 are joined by pressurizing and heating in this state, the semiconductor chip 7 is mounted on the substrate 13. The NCF 8 functions as an adhesive for bonding the semiconductor chip 7 to the substrate 13 and also functions as an underfill material between the semiconductor chip 7 and the substrate 13. The NCF 8 is softened by the heating at the time of the mounting and thereafter solidified in a subsequent cooling step, to function as the adhesive and the underfill material. At this time, owing to the presence of the NCF 8 also on the side surfaces of the semiconductor chip 7, the fillet 14 of the NCF 8 is formed on the side surfaces of the semiconductor chip 7 mounted on the substrate 13. Consequently, the enlarged fillet 14 can increase the mounting strength of the semiconductor chip 7 on the substrate 13, a stress relaxation effect, and so on.

Even in the absence of the NCF 8 on the side surfaces of the semiconductor chip 7, a surplus of the NCF 8 present between the semiconductor chip 7 and the substrate 13 may creep up along the side surfaces of the semiconductor chip 7 in the pressurizing step at the time of the mounting, so that a fillet of the NCF 8 may be formed on the side surfaces of the semiconductor chip 7. However, the NCF 8 that creeps up is small in amount and cannot form a sufficient fillet. Regarding this, in the manufacturing method of the embodiment, owing to the presence of the NCF 8 also on the side surfaces of the semiconductor chip 7, the NCF 8 on the side surfaces promotes the formation of the fillet 14 on the side surfaces of the semiconductor chip 7 and also contributes to the enlargement of the fillet 14. That is, with a sufficient amount of the NCF 8, it is possible to form the large fillet 14 on the side surfaces of the semiconductor chip 7 mounted on the substrate 13. Further, the fillet 14 can protect the side surfaces of the semiconductor chip 7. Improving the bonding strength of the semiconductor chip 7 to the substrate 13 and increasing the stress relaxation effect, the fillet 14 is capable of inhibiting the semiconductor chip 7 from peeling off even if the substrate 13 is contracted by, for example, heat application. Therefore, it is possible to provide the semiconductor device 15 excellent in reliability, heat resistance, and so on.

Figure 7:
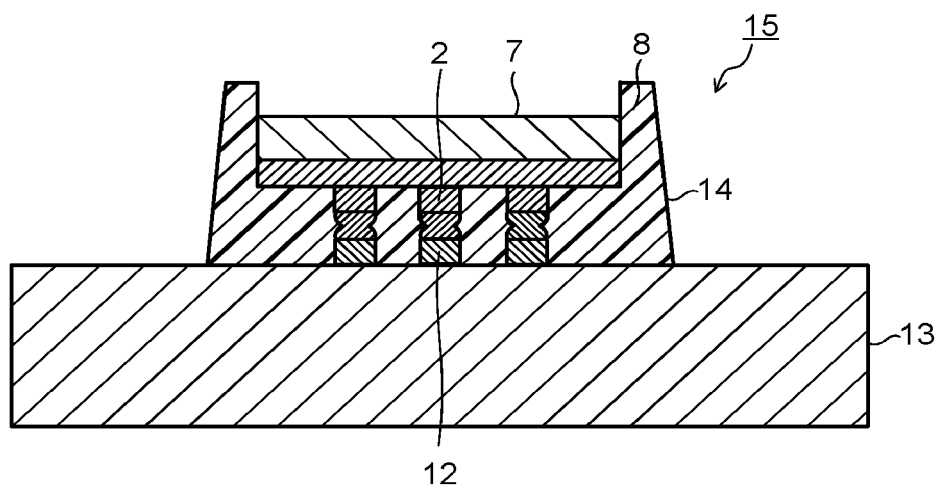
FIG. 7 is a cross-sectional view illustrating a first example of a semiconductor device manufactured by the semiconductor device manufacturing method of the embodiment.
Figure 8:
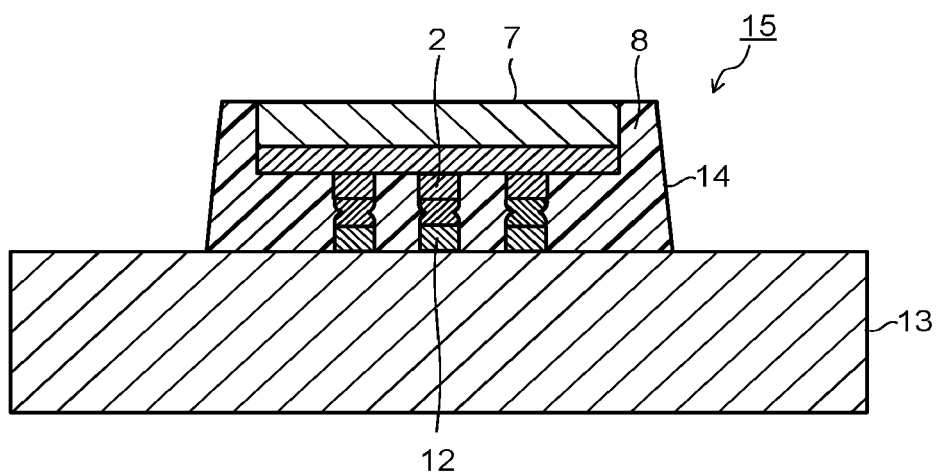
FIG. 8 is a cross-sectional view illustrating a second example of the semiconductor device manufactured by the semiconductor device manufacturing method of the embodiment.

In the semiconductor device 15 manufactured by the manufacturing method of the embodiment, since the NCF 8 on the side surfaces of the semiconductor chip 7 is present up to inner parts of the first trenches 5, an upper portion of the fillet 14 formed of the NCF 8 may protrude higher than the semiconductor chip 7 as illustrated in FIG. 7. The fillet 14 may have such a shape, but by specially designing the mounting tool of the semiconductor chip 7, it is possible to manufacture the semiconductor device 15 having the fillet 14 in various kinds of shapes. For example, by holding the semiconductor chip 7 with a mounting tool larger in the planar shape than the semiconductor chip 7 and pressing the semiconductor chip 7 against the substrate 13, it is possible to make the upper surface of the fillet 14 of the NCF 8 flush with the rear surface of the semiconductor chip 7 as illustrated in FIG. 8. In a case where another semiconductor device or the like is mounted on the semiconductor chip 7, the fillet 14 having the shape illustrated in FIG. 8 is effective.

Figure 9:
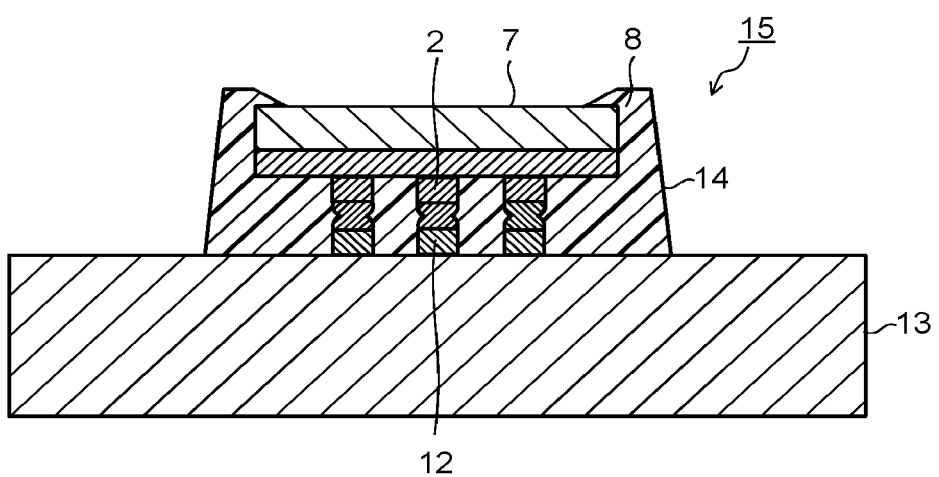
FIG. 9 is a cross-sectional view illustrating a third example of the semiconductor device manufactured by the semiconductor device manufacturing method of the embodiment.

In a case where the semiconductor chip 7 is held with a mounting tool smaller in the planar shape than the semiconductor chip 7 and is pressed against the substrate 13, the fillet 14 can be formed into a shape in which its upper portion protruding higher than the semiconductor chip 7 covers part of the outer peripheral side of the rear surface of the semiconductor chip 7 as illustrated in FIG. 9, by the heating at the time of the mounting. The fillet 14 having the shape illustrated in FIG. 9 further improves the bonding strength of the semiconductor chip 7 to the substrate 13, enabling a further improvement in the reliability, heat resistance, and so on of the semiconductor device 15. The shape of the fillet 14 can be selected according to the use purpose and required properties of the semiconductor device 15.

Second Embodiment

Figure 10A:
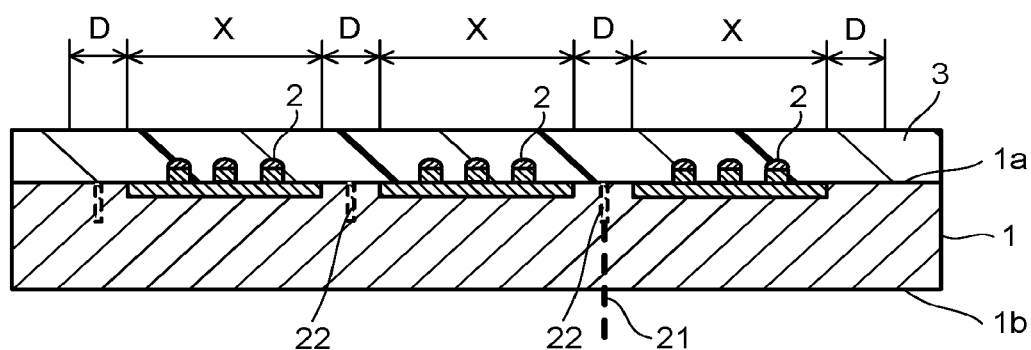
FIG. 10A to FIG. 10C are cross-sectional views illustrating a semiconductor device manufacturing method according to a second embodiment.
Figure 10B:
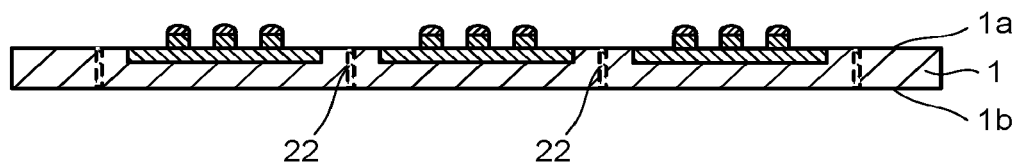
Figure 10C:
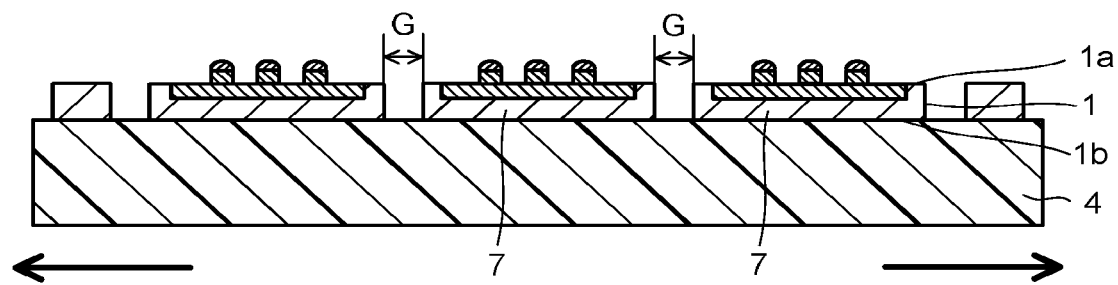

FIG. 10A to FIG. 10C and FIG. 11A to FIG. 11D are views illustrating a semiconductor device manufacturing method according to a second embodiment and illustrate the semiconductor device manufacturing method which employs stealth dicing for a step of dividing a semiconductor wafer. FIG. 10A to FIG. 10C are cross-sectional views illustrating a step of preparing the semiconductor wafer up to the step of dividing the semiconductor wafer, and FIG. 11A to FIG. 11D are cross-sectional views illustrating a step of sticking and filling a non conductive film up to a step of mounting a semiconductor chip.

First, as illustrated in FIG. 10A, a semiconductor wafer 1 is prepared. The semiconductor wafer 1 has a plurality of chip areas X which each have columnar electrodes (bump electrodes) 2 and dicing areas D which demarcate the plurality of chip areas X as in the first embodiment. On a first surface 1a having the columnar electrodes 2, of such a semiconductor wafer 1, a surface protective tape 3 is stuck. Next, the semiconductor wafer 1 whose second surface 1b opposite to the first surface 1a has not yet been ground is irradiated with laser light 21 for the stealth dicing from the second surface 1b side of the semiconductor wafer 1 along the dicing areas D.

The stealth dicing of the semiconductor wafer 1 includes: a step of focusing the laser light 21 to inner parts of the semiconductor wafer 1 to form modified layers 22 serving as starting points of the division of the semiconductor wafer 1; and a step of applying external force to the semiconductor wafer 1 in which the modified layers 22 are formed, to divide the semiconductor wafer 1 into semiconductor chips formed of the plurality of chip areas X. FIG. 10A illustrates the step of forming the modified layers 22 using the laser light 21. For causing the division, the modified layers 22 each include a wafer material modification area and a crack or the like extending in the thickness direction of the semiconductor wafer 1, and in the later step of applying the external force, the division of the semiconductor wafer 1 into the plurality of semiconductor chips starts from the modified layers 22.

Next, as illustrated in FIG. 10B, the second surface 1b of the semiconductor wafer 1 in which the modified layers 22 are formed is ground to a thickness according to the thickness of the semiconductor chips that are to be manufactured, and thereafter the surface protective tape 3 is peeled off. Next, on the ground second surface 1b of the semiconductor wafer 1, a dicing tape 4 formed of a resin tape (second resin film) is stuck. As illustrated in FIG. 10C, the dicing tape 4 stuck on the second surface 1b of the semiconductor wafer 1 in which the modified layers 22 are formed is expanded in its planar direction, whereby the division of the semiconductor wafer 1 starts from the modified layers 22. As a result of forming gaps G each between adjacent ones of the plurality of chip areas X by forming the modified layers 22 and expanding the dicing tape 4, the plurality of chip areas X are separated from one another, resulting in the formation of the plurality of semiconductor chips 7. The whole shape of the semiconductor wafer 1 having the separated semiconductor chips 7 is maintained by the dicing tape 4.

Figure 11A:
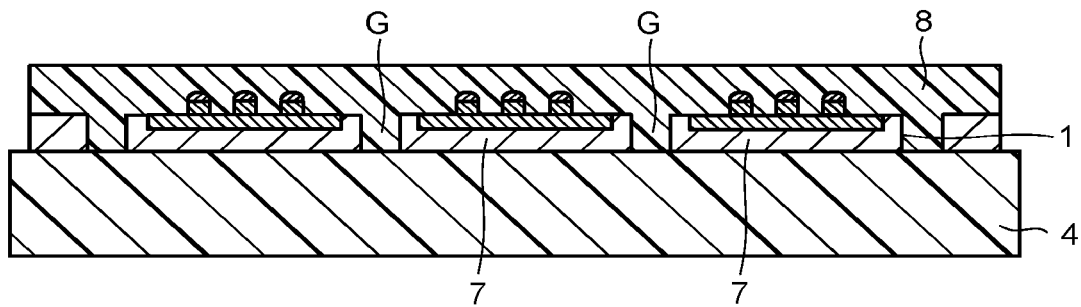
FIG. 11A to FIG. 11D are cross-sectional views illustrating the semiconductor device manufacturing method according to the second embodiment.

Next, as illustrated in FIG. 11A, a thermoplastic non conductive resin film (NCF) (first resin film) 8 is stuck on the plurality of separated semiconductor chips 7 from the first surface 1a side of the semiconductor wafer 1. At this time, parts of the NCF 8 are filled in the gaps G each present between adjacent ones of the plurality of semiconductor chips 7. The step of filling the NCF 8 in the gaps G is carried out in the same manner as in the first embodiment. For example, the sticking step under the reduced pressure and the filling step under the atmospheric pressure illustrated in FIG. 3A and FIG. 3B can be employed. The heating of the NCF 8, for example, the partial heating of its parts corresponding to the gaps G, may be combined with the atmosphere exposure of the NCF 8. Instead, the NCF 8 may be entirely heated using a heater, an oven, or the like. The step of filling the NCF 8 in the gaps G can be carried out in the same manner as in the first embodiment.

Figure 11B:
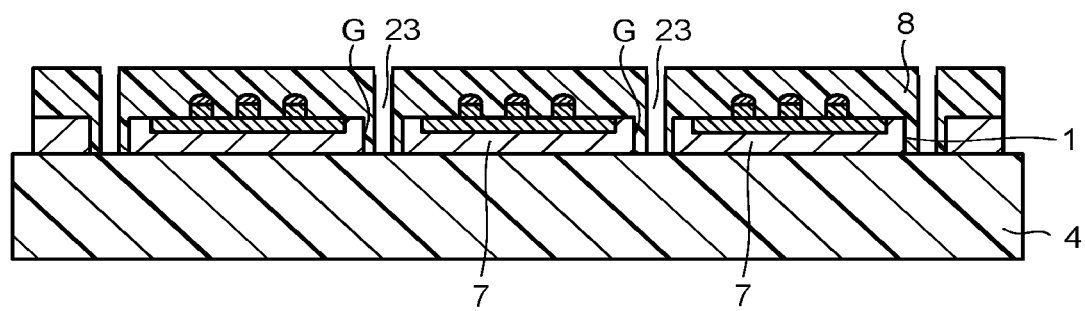

Next, as illustrated in FIG. 11B, trenches 23 are formed in the NCF 8 filled in the gaps G to divide the NCF 8 into parts corresponding to the plurality of semiconductor chips 7. At this time, the trenches 23 are formed with a width narrower than the width of the gaps G. Consequently, the NCF 8 remains on side surfaces of the two semiconductor chips 7 arranged across the gap G. As will be described later, the NCF 8 remaining on the side surfaces of the semiconductor chip 7 contributes to the formation of a fillet when the semiconductor chip 7 is mounted on a substrate, enabling an improvement in the mounting strength of the semiconductor chip 7. The trenches 23 are preferably adjusted in width such that the NCF 8 with 5 μm or more remains on each of the side surfaces of the two semiconductor chips 7, similarly to the second trenches 9 of the first embodiment.

The step of forming the trenches 23 is carried out similarly to the step of forming the second trenches 9 of the first embodiment. For example, as illustrated in FIG. 4, the NCF 8 filled in the gaps G is cut using a dicing blade 10 narrower in width than the gaps G. This makes it possible to form the trenches 23 in the NCF 8 filled in the gaps G. Another method to form the trenches 23 is, as illustrated in FIG. 5A and FIG. 5B, to irradiate the NCF 8 filled in the gaps G with laser light 11 to cut the NCF 8, followed by the expansion of the dicing tape 4 in its planar direction. As illustrated in FIG. 6, depending on the material or the like of the dicing tape 4, only with the expanding step, the trenches 23 can be formed in some case without the laser dicing step.

Figure 11C:
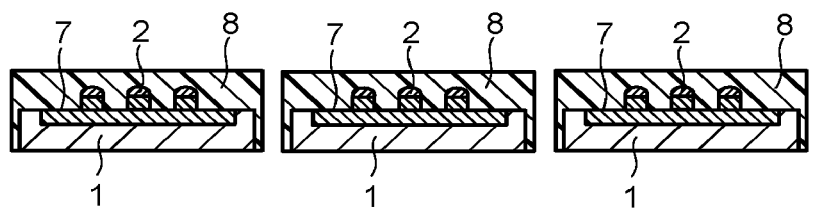
Figure 11D:
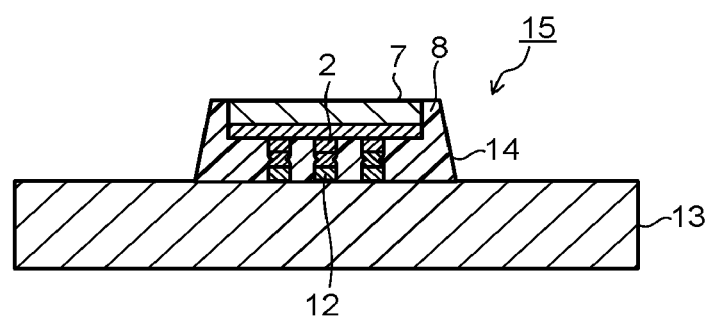

As a result of forming the trenches 23 in the NCF 8 filled in the gaps G to divide the NCF 8 into the parts corresponding to the plurality of semiconductor chips 7, the semiconductor chips 7 each having the separated part of the NCF 8 are formed. As illustrated in FIG. 11C, such semiconductor chips 7 having the NCF 8 are sequentially picked up from the dicing tape 4. Next, the semiconductor chip 7 having the NCF 8, which is picked up from the dicing tape 4, is turned upside down in the middle of the mounting step, and as illustrated in FIG. 11D, is thereafter mounted on a substrate 13 having electrodes 12, whereby a semiconductor device 15 is fabricated. The semiconductor chip 7 is mounted on the substrate 13 while its columnar electrodes 2 are connected to the electrodes 12 of the substrate 13, whereby the semiconductor device 15 is fabricated. As illustrated in FIG. 11C and FIG. 11D, in the semiconductor chip 7 formed using the stealth dicing, it is possible to inhibit the NCF 8 from protruding from the side surfaces of the semiconductor chip 7. Therefore, it is possible to reduce suction mistakes and so on when the semiconductor chip 7 having the NCF 8 is picked up.

(Another Semiconductor Device)

Figure 12:
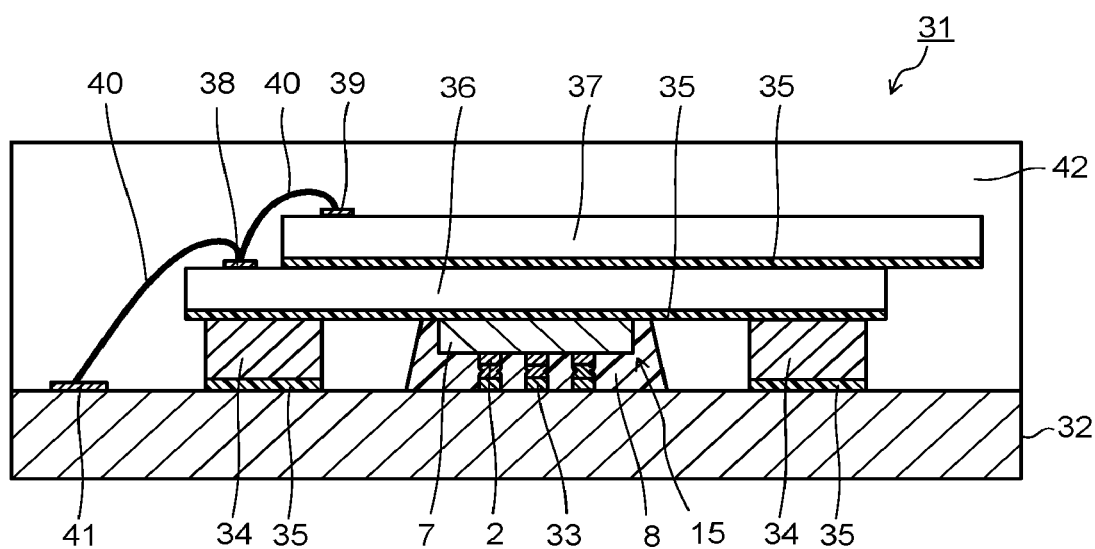
FIG. 12 is a cross-sectional view illustrating a semiconductor storage device including the semiconductor device manufactured by the semiconductor device manufacturing method of the embodiment.

The semiconductor device 15 fabricated by the manufacturing methods of the above-described first and second embodiments is usable as it is, or is usable as part of another semiconductor device. FIG. 12 is a view illustrating an example in which the semiconductor device 15 is used as part of a more functionalized semiconductor device, for example, a semiconductor storage device. A semiconductor storage device 31 illustrated in FIG. 12 includes the semiconductor device 15 provided on a substrate 32. The semiconductor device 15 is mounted on the substrate 32 with the electrodes 2 of the semiconductor chip 7 connected to electrodes 33 of the substrate 32. The semiconductor chip 7 functions as, for example, a controller chip. A spacer 34, for example, a silicon spacer is disposed around the semiconductor device 15. The spacer 34 is bonded to the substrate 32 with DAF (Die Attach Film) 35.

On the semiconductor chip 7 and the spacer 34, a first memory chip 36 and a second memory chip 37 are disposed. The first memory chip 36 is bonded to the semiconductor chip 7 and the spacer 34 with DAF 35. The second memory chip 37 is bonded to the first memory chip 36 with DAF 35. The second memory chip 37 is stacked on the first memory chip 36 in a stepped manner so that an electrode 38 of the first memory chip 36 is exposed. An electrode 39 of the second memory chip 37 is electrically connected with the electrode 38 of the first memory chip 36 through a bonding wire 40, and the electrode 38 of the first memory chip 36 is electrically connected with an electrode 41 of the substrate 32 through a bonding wire 40. On the substrate 32, a mold resin 42 is formed so as to encapsulate the constituent elements. For the mounting of the controller chip (7) in such a semiconductor storage device 31, the semiconductor device manufacturing methods of the embodiments are effectively used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:

dividing a semiconductor wafer including a plurality of chip areas which each have a columnar electrode and dicing areas which demarcate the plurality of chip areas, along the dicing areas to separate the plurality of chip areas and thus form a plurality of semiconductor chips;

sticking a first resin film on the plurality of semiconductor chips from a first surface side, having the columnar electrodes, of the semiconductor wafer while filling parts of the first resin film in gaps that are each present between adjacent ones of the plurality of semiconductor chips;

dividing the first resin film into parts corresponding to the plurality of semiconductor chips by forming trenches narrower in width than the gaps in the first resin film that is filled in the gaps while leaving the first resin film on side surfaces of the divided semiconductor chips; and sequentially picking up the plurality of semiconductor chips each having a part of the divided first resin film and mounting the picked semiconductor chip on a substrate with the first resin film therebetween while joining the columnar electrode of the semiconductor chip to an electrode of the substrate, wherein the dividing the semiconductor wafer includes:
sticking a second resin film on a second surface, opposite to the first surface, of the semiconductor wafer; and
forming first trenches from the first surface side of the semiconductor wafer along the dicing areas while maintaining a wafer shape of the semiconductor wafer with the second resin film.

2. The method according to claim 1, wherein the sticking and filling the first resin film includes:
sticking the first resin film on the plurality of semiconductor chips under a reduced pressure; and
filling the parts of the first resin film in the gaps by exposing the plurality of semiconductor chips on which the first resin film is stuck to an atmosphere.

3. The method according to claim 2, wherein the sticking and filling the first resin film further includes heating at least the parts, corresponding to the gaps, of the first resin film exposed to the atmosphere.

4. The method according to claim 1, wherein the sticking and filling the first resin film includes:
sticking the first resin film on the plurality of semiconductor chips; and
filling the parts of the first resin film in the gaps by heating at least the parts, corresponding to the gaps, of the first resin film stuck on the plurality of semiconductor chips.

5. The method according to claim 1, wherein the dividing the first resin film includes cutting the first resin film filled in the gaps with a blade narrower in width than the gaps.

6. The method according to claim 5, wherein the dividing the first resin film further includes expanding the first resin film cut with the blade in a planer direction of the first resin film.

7. The method according to claim 1, wherein the dividing the first resin film includes irradiating the first resin film filled in the gaps with laser light to melt-cut the first resin film.

8. The method according to claim 7, wherein the dividing the first resin film further includes expanding the first resin film melt-cut with the laser light in a planar direction of the first resin film.

9. The method according to claim 1, wherein the dividing the first resin film includes expanding the first resin film in a planar direction of the first resin film to divide the first resin film.

10. The method according to claim 1, wherein the dividing the semiconductor wafer includes:
irradiating a second surface, opposite to the first surface, of the semiconductor wafer with laser light along the dicing areas to form modified layers;
grinding the second surface of the semiconductor wafer;
sticking a second resin film on the ground second surface of the semiconductor wafer; and expanding the second resin film in a planar direction of the second resin film to divide the semiconductor wafer.

11. The method according to claim 1, wherein a fillet is formed on a side surface of the semiconductor chip mounted on the substrate using the first resin film.

12. A method for manufacturing a semiconductor device comprising:
dividing a semiconductor wafer including a plurality of chip areas which each have a columnar electrode and dicing areas which demarcate the plurality of chip areas, along the dicing areas to separate the plurality of chip areas and thus form a plurality of semiconductor chips;
sticking a first resin film on the plurality of semiconductor chips from a first surface side having the columnar electrodes, of the semiconductor wafer while filling parts of the first resin film in gaps that art each present between adjacent ones of the plurality of semiconductor chips;
dividing the first resin film into parts corresponding to the plurality of semiconductor chips by forming trenches narrower in width than the gaps in the first resin film that is filled in the gaps while leaving the first resin film on side surfaces of the divided semiconductor chips; and
sequentially picking up the plurality of semiconductor chips each having a part of the divided first resin film and mounting the picked semiconductor chip on a substrate with the first resin film therebetween while joining the columnar electrode of the semiconductor chip to an electrode of the substrate,
wherein the sticking and filling the first resin film includes:
sticking the first resin film on the plurality of semiconductor chips under a reduced pressure; and
filling the parts of the first resin film in the gaps by exposing the plurality of semiconductor chips on which the first resin film is stuck to an atmosphere.

13. The method according to claim 12, wherein the sticking and filling the first resin film further includes heating at least the parts, corresponding to the gaps, of the first resin film exposed to the atmosphere.

14. The method according to claim 12, wherein the dividing the first resin film includes cutting the first resin film filled in the gaps with a blade narrower in width than the gaps.

15. The method according to claim 12, wherein the dividing the first resin film includes irradiating the first resin film filled in the gaps with laser light to melt-cut the first resin film.

16. A method for manufacturing a semiconductor device comprising:
dividing a semiconductor wafer including a plurality of chip areas which each have a columnar electrode and dicing areas which demarcate the plurality of chip areas, along the dicing areas to separate the plurality of chip areas and thus form a plurality of semiconductor chips;
sticking a first resin film on the plurality of semiconductor chips from a first surface side having the columnar electrodes, of the semiconductor wafer while filling parts of the first resin film in gaps that are each present between adjacent ones of the plurality of semiconductor chips;
dividing the first resin film into parts corresponding to the plurality of semiconductor chips by forming trenches narrower in width than the gaps in the first resin film that is filled in the gaps while leaving the first resin film on side surfaces of the divided semiconductor chips; and sequentially picking up the plurality of semiconductor chips each having a part of the divided first resin film and mounting the picked semiconductor chip on a substrate with the first resin film therebetween while joining the columnar electrode of the semiconductor chip to an electrode of the substrate, wherein the dividing the semiconductor wafer includes:
irradiating a second surface, opposite to the first surface, of the semiconductor wafer with laser light along the dicing areas to form modified layers;
grinding the second surface of the semiconductor wafer; sticking a second resin film on the ground second surface of the semiconductor wafer; and
expanding the second resin film in a planar direction of the second resin film to divide the semiconductor wafer.

17. The method according to claim 16, wherein the sticking and filling the first resin film includes:
sticking the first resin film on the plurality of semiconductor chips under a reduced pressure; and
filling the parts of the first resin film in the gaps by exposing the plurality of semiconductor chips on which the first resin film is stuck to an atmosphere.

18. The method according to claim 17, wherein the sticking and filling the first resin film further includes heating at least the parts corresponding to the gaps of the first resin film exposed to the atmosphere.

19. The method according to claim 16, wherein the dividing the first resin film includes cutting the first resin film filled in the gaps with a blade narrower in width than the gaps.

* * * * *